United States Patent
Miyazoe et al.

(10) Patent No.: US 11,289,650 B2
(45) Date of Patent: Mar. 29, 2022

(54) STACKED ACCESS DEVICE AND RESISTIVE MEMORY

(71) Applicant: INTERNATIONAL BUSINESS MACHINES CORPORATION, Armonk, NY (US)

(72) Inventors: Hiroyuki Miyazoe, White Plains, NY (US); Gloria W. Y. Fraczak, Bayside, NY (US); Kumar R. Virwani, Santa Clara, CA (US); Takashi Ando, Tuckahoe, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/291,177

(22) Filed: Mar. 4, 2019

(65) Prior Publication Data
US 2020/0287135 A1  Sep. 10, 2020

(51) Int. Cl.
*H01L 29/02* (2006.01)
*H01L 45/00* (2006.01)
*H01L 27/24* (2006.01)

(52) U.S. Cl.
CPC .......... *H01L 45/16* (2013.01); *H01L 27/2427* (2013.01); *H01L 45/08* (2013.01); *H01L 45/1233* (2013.01)

(58) Field of Classification Search
CPC ............. H01L 27/2463; H01L 45/1266; H01L 45/141; H01L 45/1675; H01L 27/2427; H01L 45/08; H01L 45/1233; H01L 45/16
See application file for complete search history.

(56) References Cited

U.S. PATENT DOCUMENTS

| | | | | |
|---|---|---|---|---|
| 4,931,214 A * | 6/1990 | Worrell | ................... | C25B 11/04 252/520.2 |
| 6,852,550 B2 * | 2/2005 | Tuttle | ..................... | B82Y 25/00 216/22 |
| 7,105,408 B2 * | 9/2006 | Dennison | ............ | H01L 27/2409 257/296 |
| 7,388,771 B2 * | 6/2008 | Ho | ......................... | B82Y 10/00 365/148 |
| 7,399,655 B2 * | 7/2008 | Dennison | ............ | H01L 27/2427 257/E27.004 |
| 7,491,574 B2 * | 2/2009 | Dennison | ................ | H01L 45/06 438/102 |

(Continued)

OTHER PUBLICATIONS

Luo et al., "Demonstration of 3D Vertical RRAM with Ultra Low-leakage, High-selectivity and Self-compliance Memory Cells," IEDM15-245 (2015).*

(Continued)

*Primary Examiner* — Jay C Kim
(74) *Attorney, Agent, or Firm* — Tutunjian & Bitetto, P.C.; Randall Bluestone

(57) ABSTRACT

A semiconductor device including stacked access device and resistive memory includes a stack disposed on a base structure, the stack including an access device stack and a resistive random-access memory (ReRAM) device stack, sidewall spacers disposed along a portion of the stack, a dielectric layer disposed over the stack, the sidewall spacers and the base structure, and an interlevel dielectric disposed on the dielectric layer.

6 Claims, 6 Drawing Sheets

(56) References Cited

U.S. PATENT DOCUMENTS

| | | | | |
|---|---|---|---|---|
| 7,588,626 B2* | 9/2009 | Gopalan | | C01B 13/0255 95/45 |
| 7,589,343 B2 | 9/2009 | Lowrey | | |
| 7,659,162 B2* | 2/2010 | Lim | | H01L 27/2436 438/239 |
| 7,855,378 B2* | 12/2010 | Lin | | H01L 45/06 257/4 |
| 7,923,285 B2* | 4/2011 | Lai | | H01L 45/1683 438/102 |
| 8,080,439 B2* | 12/2011 | Martinez, Jr. | | G11C 13/0004 257/E21.409 |
| 8,134,139 B2* | 3/2012 | Lin | | H01L 45/122 257/4 |
| 8,497,182 B2* | 7/2013 | Lung | | H01L 45/06 438/397 |
| 8,809,831 B2* | 8/2014 | Herner | | H01L 45/06 257/5 |
| 8,830,725 B2 | 9/2014 | Bethune et al. | | |
| 8,896,045 B2* | 11/2014 | Philipp | | H01L 45/148 257/298 |
| 8,921,155 B2* | 12/2014 | Zhou | | H01L 45/08 257/E21.006 |
| 8,963,114 B2* | 2/2015 | Liao | | H01L 45/04 257/2 |
| 9,165,787 B2* | 10/2015 | Kang | | H01L 21/31144 |
| 9,172,036 B2* | 10/2015 | Chen | | H01L 45/122 |
| 9,231,197 B2* | 1/2016 | Tu | | H01L 45/04 |
| 9,331,277 B2* | 5/2016 | Chen | | H01L 45/16 |
| 9,385,316 B2* | 7/2016 | Liao | | H01L 45/146 |
| 9,425,392 B2* | 8/2016 | Chang | | H01L 45/1253 |
| 9,431,603 B1* | 8/2016 | Hsieh | | H01L 45/04 |
| 9,431,609 B2* | 8/2016 | Dang | | H01L 45/08 |
| 9,450,183 B2* | 9/2016 | Huang | | H01L 45/1273 |
| 9,461,245 B1* | 10/2016 | Yang | | H01L 45/1253 |
| 9,537,094 B2* | 1/2017 | Chang | | H01L 45/04 |
| 9,589,635 B2 | 3/2017 | Bajaj et al. | | |
| 9,627,613 B2* | 4/2017 | Trinh | | H01L 45/1253 |
| 9,647,207 B2* | 5/2017 | Trinh | | H01L 45/08 |
| 9,806,254 B2* | 10/2017 | Sung | | H01L 45/1675 |
| 9,818,481 B2 | 11/2017 | Park et al. | | |
| 9,847,481 B2* | 12/2017 | Chang | | H01L 27/24 |
| 9,853,091 B2* | 12/2017 | Chou | | H01L 45/08 |
| 9,853,215 B1* | 12/2017 | Tseng | | H01L 45/08 |
| 9,954,166 B1* | 4/2018 | Lin | | H01L 45/1233 |
| 9,991,315 B2 | 6/2018 | Terai et al. | | |
| 10,003,022 B2* | 6/2018 | Liu | | H01L 45/122 |
| 10,090,465 B2* | 10/2018 | Hsu | | H01L 45/1675 |
| 10,153,432 B2* | 12/2018 | Zhu | | H01L 45/1233 |
| 10,164,182 B1* | 12/2018 | Trinh | | H01L 45/08 |
| 10,193,065 B2* | 1/2019 | Dang | | H01L 45/12 |
| 10,276,485 B2* | 4/2019 | Chen | | H01L 21/768 |
| 10,276,779 B2* | 4/2019 | Chang | | H01L 43/02 |
| 10,283,700 B2* | 5/2019 | Lin | | H01L 43/08 |
| 10,340,450 B2* | 7/2019 | Hsu | | H01L 45/145 |
| 10,361,367 B1* | 7/2019 | Ando | | H01L 45/146 |
| 10,410,717 B2* | 9/2019 | Sugimae | | H01L 45/085 |
| 10,411,070 B2* | 9/2019 | Lee | | H01L 45/1675 |
| 10,553,647 B2* | 2/2020 | Grobis | | G11C 13/0007 |
| 10,559,751 B1* | 2/2020 | Yang | | H01L 45/1675 |
| 10,573,811 B2* | 2/2020 | Tseng | | H01L 45/1675 |
| 10,622,555 B2* | 4/2020 | Trinh | | H01L 45/1675 |
| 10,622,557 B2* | 4/2020 | Kim | | H01L 45/1666 |
| 10,818,544 B2* | 10/2020 | Lin | | H01L 43/08 |
| 10,833,266 B2* | 11/2020 | Ando | | H01L 45/1675 |
| 2006/0289848 A1* | 12/2006 | Dennison | | H01L 45/06 257/3 |
| 2011/0133147 A1* | 6/2011 | Cheung | | H01L 27/101 257/1 |
| 2011/0227023 A1 | 9/2011 | Bethune et al. | | |
| 2013/0082229 A1* | 4/2013 | Chen | | H01L 45/122 257/4 |
| 2014/0258626 A1* | 9/2014 | Kang | | H01L 27/222 711/125 |
| 2017/0256312 A1* | 9/2017 | Sugimae | | G11C 13/0069 |
| 2018/0012652 A1 | 1/2018 | Yang et al. | | |
| 2018/0040819 A1 | 2/2018 | Fraczak et al. | | |
| 2019/0074440 A1* | 3/2019 | Yang | | H01L 45/085 |
| 2019/0115392 A1* | 4/2019 | Bruce | | H01L 45/1233 |
| 2019/0392897 A1* | 12/2019 | Lu | | G11C 13/0069 |

OTHER PUBLICATIONS

Yalon et al., "Detection of the insulating gap and conductive filament growth direction in resistive memories," Nanoscale 7 (2015) pp. 15434-15441.*

I.G. Baek et al., Realization of Vertical Resistive Memory (VRRAM) using cost effective 3D Process, 2011 International Electron Devices Meeting, Jan. 16, 2012, pp. 31.8.1-31.8.4, IEEE.

G.W. Burr, et al., Access Devices for 3D Crosspoint Memory, Journal of Vacuum Science & Technology, Jul./Aug. 2014, pp. 040802-1-040802-23, vol. 32, No. 4.

T. Gokmen et al., Acceleration of Deep Neural Network Training with Resistive Cross-Point Devices:Design Considerations, Frontiers in Neuroscience, Jul. 21, 2016, pp. 1-13, vol. 10, Article 333.

H.S. Philip Wong et al., Metal-Oxide RRAM, Proceedings of the IEEE, Jun. 2012, pp. 1951-1970, vol. 100 No. 6, IEEE.

* cited by examiner

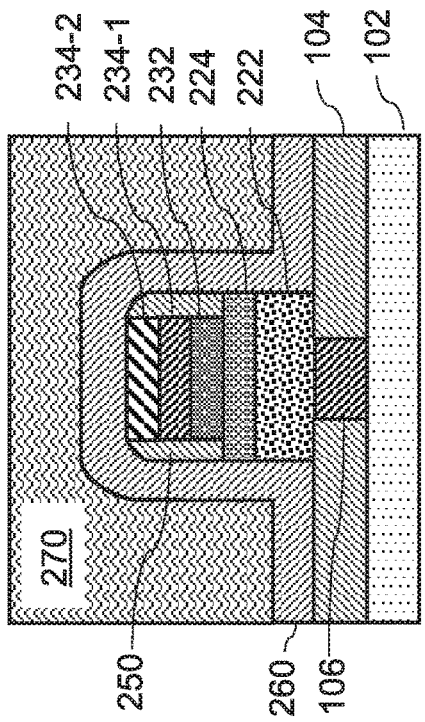
FIG. 14
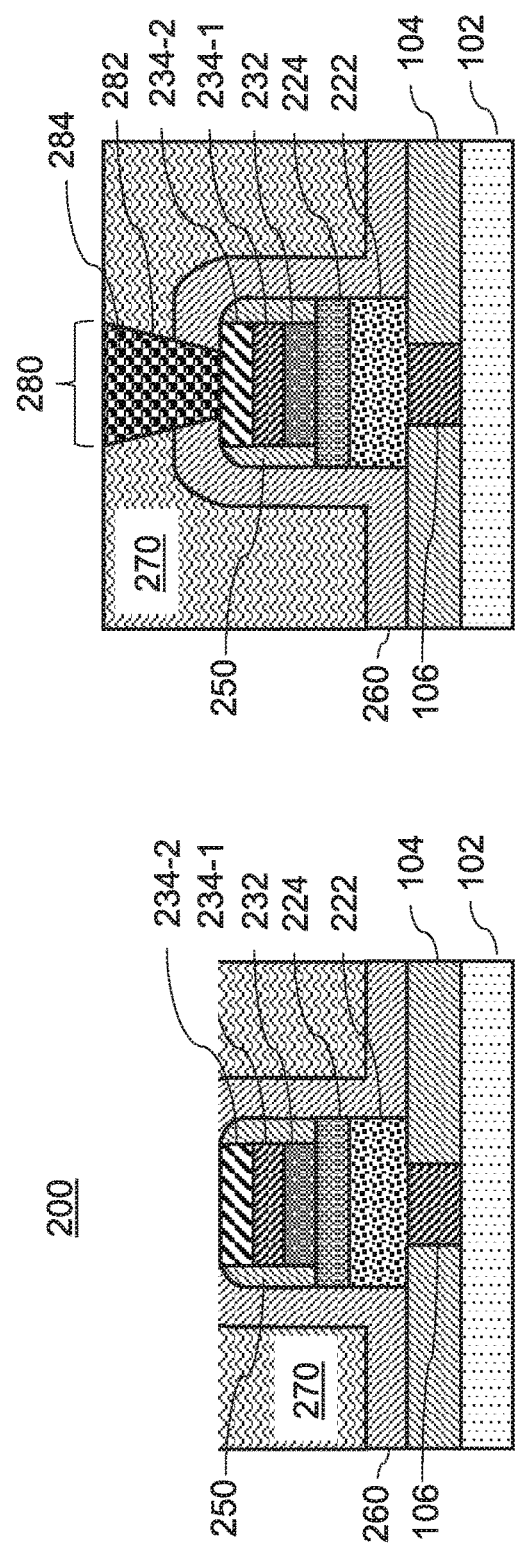
FIG. 15
FIG. 16

STACKED ACCESS DEVICE AND RESISTIVE MEMORY

BACKGROUND

The present invention generally relates to semiconductor devices, and more particularly to stacked access device and resistive memory, and methods of forming the same.

A memory cell is a component of a computer memory device that includes an electronic circuit that stores one bit of binary information. One type of memory cell is a random-access memory (RAM) cell. Examples of RAM memory devices include, e.g., volatile memory devices and non-volatile memory devices. One example of a non-volatile memory is resistive random-access memory (ReRAM). ReRAM technology works by creating defects in a thin dielectric layer (e.g., oxygen vacancies in a thin metal oxide layer), which can charge and drift under an electric field. The motion of ions and vacancies in the thin dielectric layer is similar to the motion of electrons and holes in a semiconductor.

ReRAM technology can be used for electronic synapse devices, memristors for neuromorphic computing, and high-density/high-speed non-volatile memory applications. For example, in neuromorphic computing applications, ReRAM can be used as a connection or synapse between a pre-neuron and a post-neuron, representing the connection weight in the form of device resistance, and multiple pre-neurons and post-neurons can be connected through a crossbar array of ReRAM devices to express a fully-connected neural network.

SUMMARY

In accordance with an embodiment of the present invention, a method for fabricating a semiconductor device including stacked access device and resistive memory is provided. The method includes forming a stack on a base structure. The stack includes an access device stack disposed on a resistive random-access memory (ReRAM) device stack, and a mask disposed on the access device stack. The method further includes forming a first dielectric layer over the stack after patterning the access device stack and the mask, and creating sidewall spacers disposed along the access device stack from the first dielectric layer.

In accordance with another embodiment of the present invention, a method for fabricating a semiconductor device including stacked access device and resistive memory is provided. The method includes forming a stack on a base structure. The stack includes a resistive random-access memory (ReRAM) device stack disposed on an access device stack, and a mask disposed on the ReRAM device stack. The method further includes forming a first dielectric layer over the stack after patterning the ReRAM device stack and the mask, and creating sidewall spacers disposed along the ReRAM device stack from the first dielectric layer.

In accordance with yet another embodiment of the present invention, a semiconductor device including stacked access device and resistive memory is provided. The device includes a stack disposed on a base structure, the stack including an access device stack and a resistive random-access memory (ReRAM) device stack, sidewall spacers disposed along a portion of the stack, a dielectric layer disposed over the stack, the sidewall spacers and the base structure, and an interlevel dielectric disposed on the dielectric layer.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 14 is a cross-sectional view of the formation of an interlayer dielectric during the fabrication of the semiconductor device, in accordance with an embodiment of the present invention;

FIG. 15 is a cross-sectional view of the removal of the sacrificial gate structure during the fabrication of a semiconductor device, in accordance with an embodiment of the present invention;

FIG. 16 is a cross-sectional view of the removal of layers from the nanosheet stack during the fabrication of a semiconductor device, in accordance with an embodiment of the present invention.

DETAILED DESCRIPTION

Figure 1:
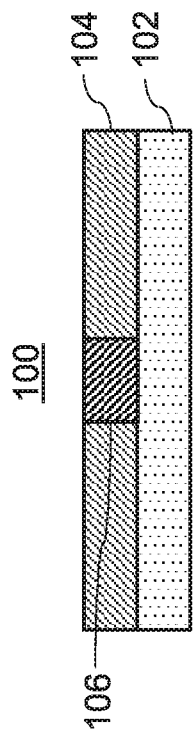
FIG. 1 is a cross-sectional view of the formation of a dielectric layer on a substrate during the fabrication of a semiconductor device, in accordance with an embodiment of the present invention.

A processing unit that includes resistive memory components can utilize a stochastic weight update rule, where positive and negative pulses with a magnitude of half of a switching voltage (Vs) are applied. Coincidence events can be distinguished if the memory element does not change states when Vs/2 is applied. For filamentary resistive random-access memory (ReRAM) devices, device resistance does not depend much on applied voltage after filament formation. Therefore, half selected devices (Vs/2) can still experience approximately half of leakage current that goes through selected devices (Vs). This can add up to large currents for an entire crossbar array, can limit the size of the array, and can significantly contribute to power consumption. Access devices can be used to suppress sneak path currents through unselected devices. However, this does not help reduce the leakage currents through half selected devices.

The embodiments described herein provide a ReRAM device and an access device that can be stacked using a single patterning step to improve density scaling and process simplicity. In one illustrative embodiment, the stack can include the access device formed on the ReRAM device. In another illustrative embodiment, the stack can include the ReRAM device formed on the access device.

The access device threshold voltage and the ReRAM switching voltage need to be sufficiently separated to have a voltage window for sensing. The embodiments described herein can provide a ReRAM device and an access device stack that can exhibit the following relationship: Half select voltage (Vs/2)<access device threshold voltage<sense voltage<ReRAM switching threshold<full select voltage (Vs).

The ReRAM device can be a metal oxide based memory device including any suitable metal oxide (e.g., transition metal oxide). The access device can be a mixed ionic-electronic conductor (MIEC) access device. For example, the access device can include, e.g., a copper germanium sulfide material ($Cu_xGe_yS_z$), although other suitable materials are contemplated.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher-level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a cross-sectional view of a semiconductor device 100 is provided.

As shown, the device 100 includes a substrate 102. The substrate 102 can include any suitable substrate structure, e.g., a bulk semiconductor, a semiconductor-on-insulator (SOI) substrate, etc. In one example, the substrate 102 can include a silicon-containing material. Illustrative examples of Si-containing materials suitable for the substrate 102 can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc.

As further shown, a dielectric layer 104 is formed on the substrate 102. The dielectric layer 104 can include any suitable material in accordance with the embodiments described herein. Examples of suitable materials that can be included in the dielectric layer 104 include, but are not limited to, nitride materials (e.g., silicon nitride (SiN)), oxide materials (e.g., silicon dioxide ($SiO_2$)), oxynitride materials (e.g., silicon oxynitride (SiON)), etc.

Figure 2:
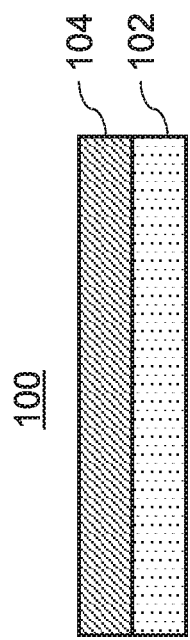
FIG. 2 is a cross-sectional view of the formation of a bottom electrode layer within the dielectric layer during the fabrication of the semiconductor device, in accordance with an embodiment of the present invention.

With reference to FIG. 2, the dielectric layer 104 is patterned to create an opening, and a bottom electrode layer 106 is formed in the opening. The bottom electrode layer 106 can be formed by depositing a bottom electrode layer material, and planarizing the bottom electrode layer material (e.g., by using chemical-mechanical planarization (CMP)). The bottom electrode layer 106 can include any suitable material in accordance with the embodiments described herein. Examples of suitable materials that can be included in the bottom electrode layer 106 include, but are not limited to, titanium-based materials (e.g., titanium nitride materials (e.g., TiN)), tantalum-based materials (e.g., tantalum nitride materials (e.g., TaN)), tungsten-based materials (e.g., W), etc.

Figure 3:
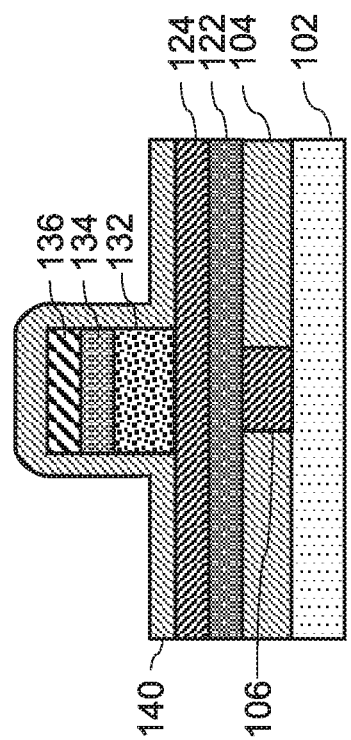
FIG. 3 is a cross-sectional view of the formation of a stack during the fabrication of a semiconductor device, in accordance with an embodiment of the present invention.

With reference to FIG. 3, a stack 110 is formed on the dielectric layer 104 and the bottom electrode layer 106. The stack 110 can include a ReRAM device stack 120, an access device stack 130 disposed on the ReRAM device stack 120, and a mask 136 disposed on the access device stack 130. The access device stack 130 can be smaller than the ReRAM device stack 120.

The access device threshold voltage and the ReRAM switching voltage can be sufficiently separated to have a voltage window for sensing. Additionally, the ReRAM device stack 120 and the access device stack 130 can exhibit the following relationship: Half select voltage (Vs/2)<access device threshold voltage<sense voltage<ReRAM switching threshold<full select voltage (Vs).

As shown, the ReRAM device stack 120 can include a metal oxide layer 122 and a middle electrode layer 124 disposed on the transition metal oxide layer 122.

In one embodiment, the metal oxide layer 122 can include a transition metal oxide material. Examples of metal oxide materials that can be included in the metal oxide layer 122 include, but are not limited to, hafnium oxide materials ($HfO_x$), tantalum oxide materials ($TaO_x$), aluminum oxide materials (AlOx), zirconium oxide materials (ZrOx), titanium oxide materials ($TiO_x$), etc.

The middle electrode layer 124 can include any suitable material in accordance with the embodiments described herein. Examples of suitable materials that can be included in the middle electrode layer 124 include, but are not limited to, titanium-based materials (e.g., Ti and/or TiN), tantalum-based materials (e.g., TaN), etc.

As further shown, the access device stack 130 can include a mixed ionic-electronic conductor (MIEC) layer 132 and a top electrode layer 134 disposed on the MIEC layer 132. The MIEC layer 132 and the top electrode layer 134 can include any suitable materials in accordance with the embodiments described herein. For example, the MIEC layer 132 can include, e.g., a copper germanium sulfide material ($Cu_xGe_yS_z$), and the top electrode layer 134 can include, e.g., ruthenium (Ru), iridium (Jr), platinum (Pt), and/or gold (Au).

In one embodiment, the mask 136 can include a hardmask material. The mask 136 can include any suitable material in accordance with the embodiments described herein. For example, the mask 136 can include, e.g., tantalum-based materials (e.g., TaN) and/or titanium-based materials (e.g., TiN).

In an alternative embodiment, the stack 110 can be formed such that the ReRAM device stack is formed on the access device stack. Further details regarding this embodiment will be described below with reference to FIGS. 10-16.

Figure 4:
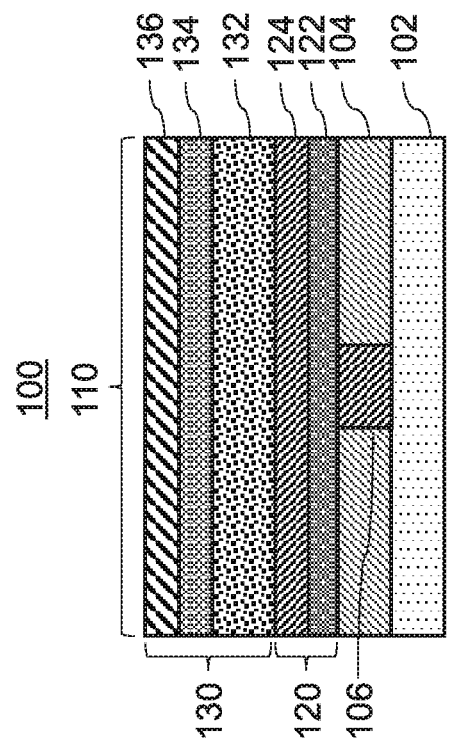
FIG. 4 is a cross-sectional view of the formation another dielectric layer on the stack during the fabrication of a semiconductor device, in accordance with an embodiment of the present invention.

With reference to FIG. 4, the access device stack 130 is patterned, and a dielectric layer 140 is formed on the stack 110. As shown, the dielectric layer 140 can be conformally deposited along the patterned access device stack 130, and along the middle electrode layer 124.

Figure 5:
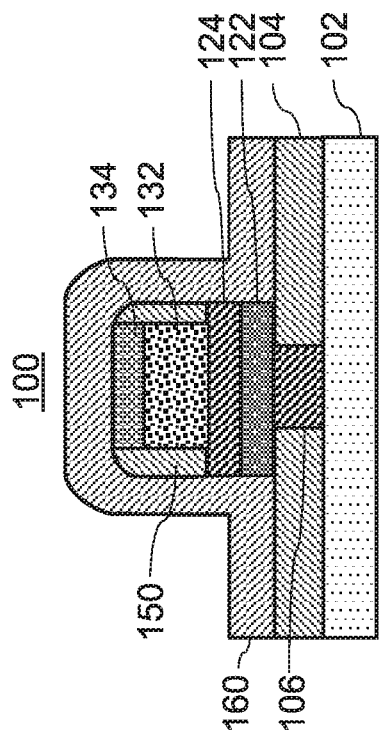
FIG. 5 is a cross-sectional view of the formation of sidewall spacers during the fabrication of a semiconductor device, in accordance with an embodiment of the present invention.

With reference to FIG. 5, sidewall spacers 150 are formed on the sidewalls of the access device stack 130. The sidewall spacers 150 can be formed by etching portions of the dielectric layer 140.

Figure 6:
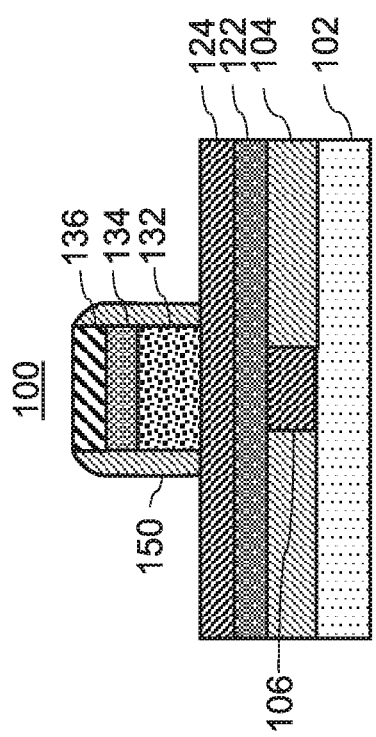
FIG. 6 is a cross-sectional view of the formation of yet another dielectric layer during the fabrication of the semiconductor device, in accordance with an embodiment of the present invention.

With reference to FIG. 6, the ReRAM device stack 120 is patterned, and a dielectric layer 160 is formed on the stack 110 and the dielectric layer 104. As shown, the mask 136 is removed from the stack 110 during the patterning of the ReRAM device stack 120, and the dielectric layer 160 can be conformally deposited along the remaining portions of the stack 110 and the dielectric layer 104.

Figure 7:
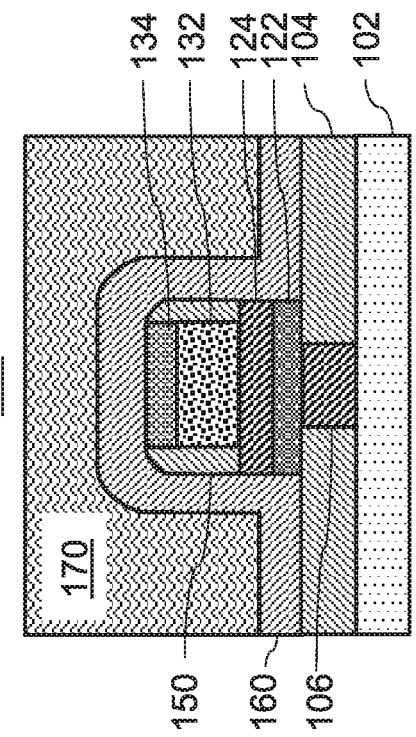
FIG. 7 is a cross-sectional view of the formation of an interlayer dielectric during the fabrication of the semiconductor device, in accordance with an embodiment of the present invention.

With reference to FIG. 7, an interlayer dielectric (ILD) 170 is formed on the dielectric layer 160. The ILD 170 can include any suitable dielectric material in accordance with the embodiments described herein. For example, the ILD 170 can include, e.g., silicon dioxide ($SiO_2$).

Figure 8:
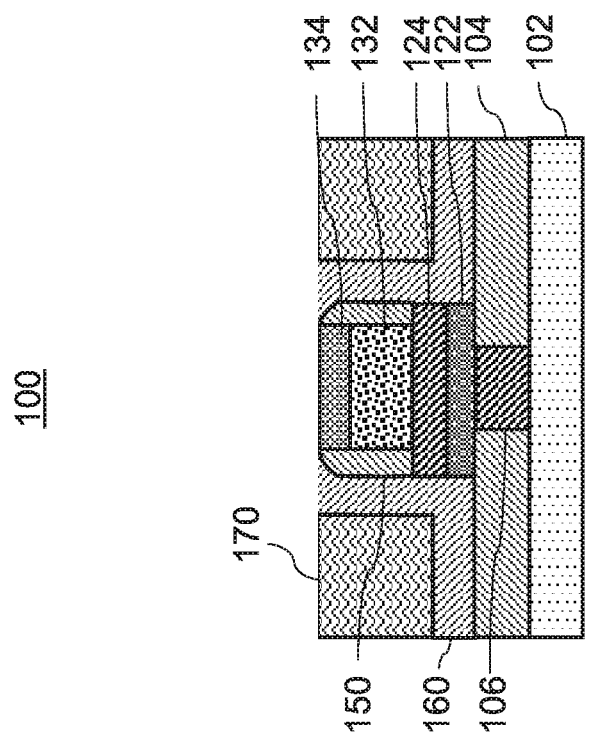
FIG. 8 is a cross-sectional view of additional device processing performed during the fabrication of the semiconductor device, in accordance with an embodiment of the present invention.

With reference to FIG. 8, the ILD 170 and the dielectric layer 160 can be planarized up to the top electrode layer 134.

Figure 9:
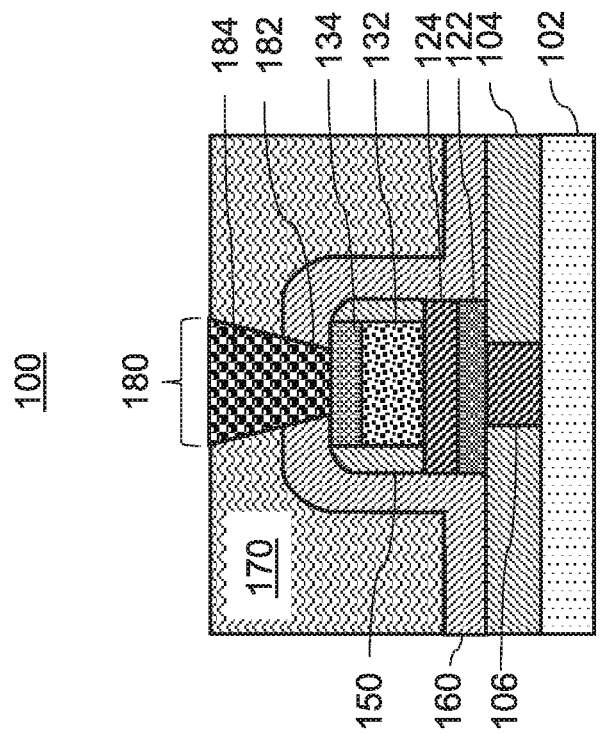
FIG. 9 is a cross-sectional view of alternative additional device processing performed during the fabrication of the semiconductor device, in accordance with an embodiment of the present invention.

With reference to FIG. 9, instead of planarizing the ILD 170 and the dielectric layer 160 as described in FIG. 8, a via 180 can be formed to the top electrode layer 134 through the ILD 170 and the dielectric layer 160. As shown, the via 180 can include a liner 182 and a contact 184. The liner 182 and the contact 184 can include any suitable materials in accordance with the embodiments described herein. For example, the liner 182 can include, e.g., tantalum (e.g., Ta/TaN), and the contact 184 can include, e.g., copper (Cu).

As mentioned above, the ReRAM device stack can be formed on the access device stack in accordance with an alternative embodiment, which will now be described below with reference to FIGS. 10-16.

Figure 10:
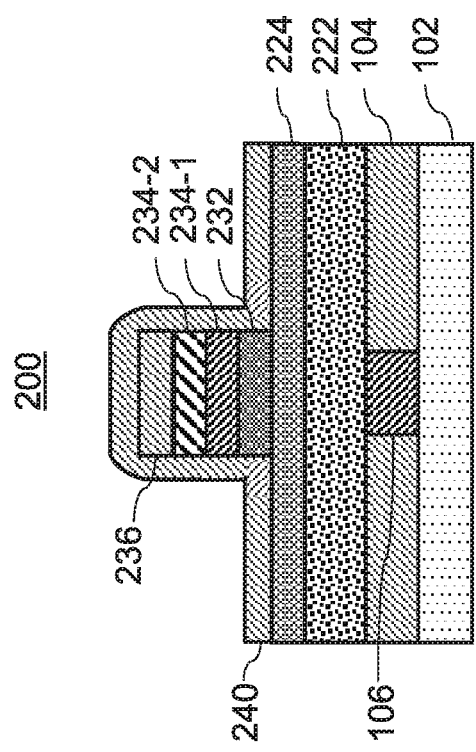
FIG. 10 is a cross-sectional view of the formation of a stack during the fabrication of a semiconductor device, in accordance with another embodiment of the present invention.

With reference to FIG. 10, a cross-sectional view of a semiconductor device 200 is provided. It is assumed that the device 200 includes a substrate 102, a dielectric layer 104 and a bottom electrode layer 106, as described above with reference to FIGS. 1-2.

The device 200 includes a stack 210 formed on the dielectric layer 104 and the bottom electrode layer 106. The stack 210 can include an access device stack 220, a ReRAM device stack 230 disposed on the access device stack 220, and a mask 236 disposed on the ReRAM device stack 230. The ReRAM device stack 230 can be smaller than the access device stack 220.

The access device threshold voltage and the ReRAM switching voltage can be sufficiently separated to have a voltage window for sensing. Additionally, the access device stack 220 and the ReRAM device stack 230 can exhibit the following relationship: Half select voltage (Vs/2)<access device threshold voltage<sense voltage<ReRAM switching threshold<full select voltage (Vs).

As shown, the access device stack 220 can include an MIEC layer 222 and a middle electrode layer 224 disposed on the MIEC layer 222. The MIEC layer 222 and the middle electrode layer 224 can include any suitable materials in accordance with the embodiments described herein. For example, the MIEC layer 222 can include, e.g., a copper germanium sulfide material ($Cu_xGe_yS_z$), and the middle electrode layer 224 can include, e.g., ruthenium (Ru), iridium (Ir), platinum (Pt), and/or gold (Au).

As further shown, the ReRAM device stack 230 can include a metal oxide layer 232, a first top electrode layer 234-1 disposed on the transition metal oxide layer 232, and a second top electrode layer 234-2 disposed on the first top electrode layer 234-1.

In one embodiment, the metal oxide layer 232 can include a transition metal oxide material. Examples of metal oxide materials that can be included in the metal oxide layer 232 include, but are not limited to, hafnium oxide materials ($HfO_x$), tantalum oxide materials ($TaO_x$), aluminum oxide materials (AlOx), zirconium oxide materials (ZrOx) and titanium oxide materials ($TiO_x$).

The first and second top electrode layers 234-1 and 234-2 can include any suitable materials in accordance with the embodiments described herein. For example, the first and second top electrode layers 234-1 and 234-2 can include, e.g., titanium-based materials (e.g., TiN and/or Ti) and/or tantalum-based materials (e.g., TaN).

In one embodiment, the mask 236 can include a hardmask material. The mask 236 can include any suitable material in accordance with the embodiments described herein. Examples of suitable materials for the mask 236 include, but are not limited to, nitride materials (e.g., silicon nitride (SiN)), oxide materials (e.g., silicon dioxide ($SiO_2$)), oxynitride materials (e.g., silicon oxynitride (SiON)), etc.

Figure 11:
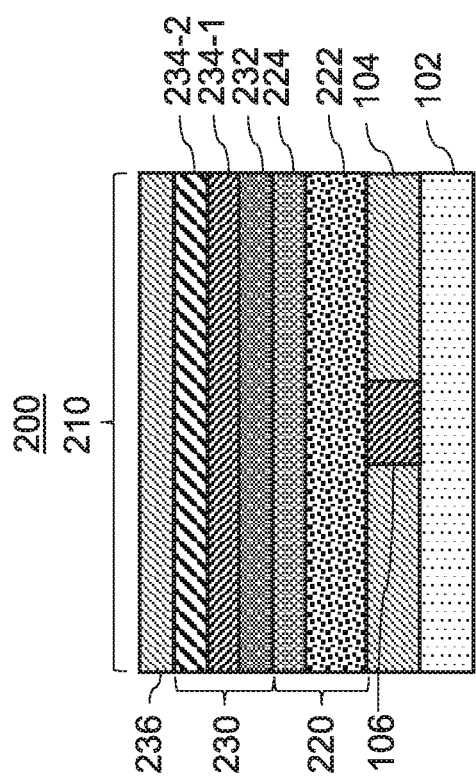
FIG. 11 is a cross-sectional view of the formation of another dielectric layer on the stack during the fabrication of the semiconductor device, in accordance with another embodiment of the present invention.

With reference to FIG. 11, the mask 236 and the ReRAM device stack 230 are patterned, and a dielectric layer 240 is formed. As shown, the dielectric layer 240 can be conformally deposited along the patterned ReRAM device stack 230 and the mask 236, and along the middle electrode layer 224.

Figure 12:
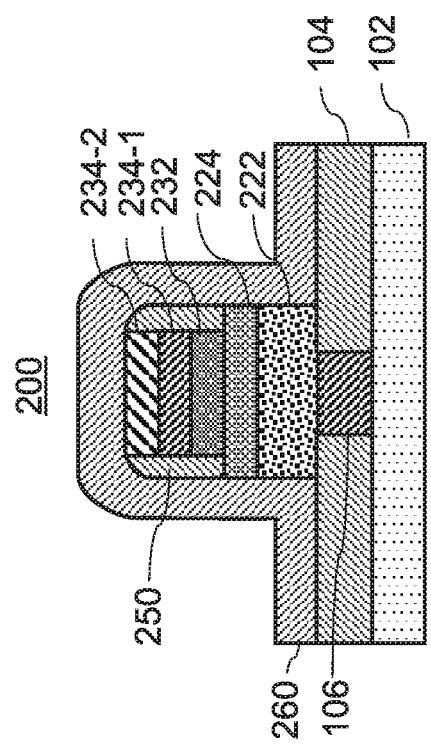
FIG. 12 is a cross-sectional view of the formation of sidewall spacers during the fabrication of the semiconductor device, in accordance with another embodiment of the present invention.

With reference to FIG. 12, sidewall spacers 250 are formed on the sidewalls of the ReRAM device stack 230. The sidewall spacers 250 can be formed by etching portions of the dielectric layer 240 using any suitable process in accordance with the embodiments described herein.

Figure 13:
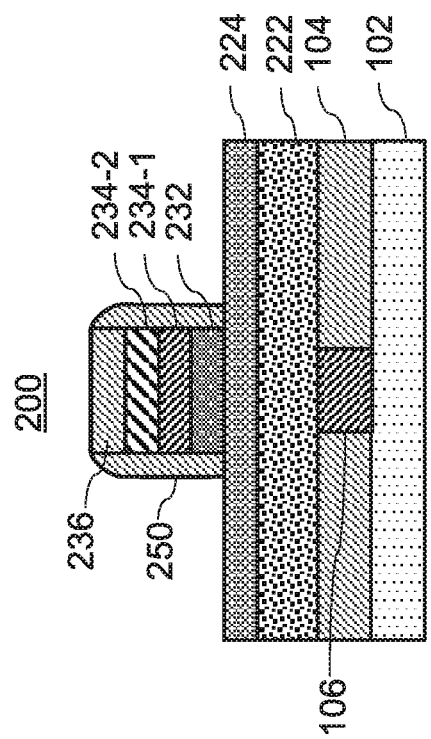
FIG. 13 is a cross-sectional view of the formation of yet another dielectric layer during the fabrication of the semiconductor device, in accordance with another embodiment of the present invention.

With reference to FIG. 13, the access device stack 220 is patterned, and a dielectric layer 260 is formed on the stack 210 and the dielectric layer 104. As shown, the mask 236 is removed during the patterning of the access device stack 220, and the dielectric layer 260 can be conformally deposited along the remaining portions of the stack 210 and the dielectric layer 104.

With reference to FIG. 14, an interlayer dielectric (ILD) 270 is formed on the dielectric layer 260. The ILD 270 can include any suitable dielectric material in accordance with the embodiments described herein. For example, the ILD 270 can include, e.g., silicon dioxide ($SiO_2$).

With reference to FIG. 15, the ILD 270 and the dielectric layer 260 can be planarized up to the second top electrode layer 234-2.

With reference to FIG. 16, instead of planarizing the ILD 270 and the dielectric layer 260 as described in FIG. 15, a via 280 can be formed to the second top electrode layer 234-2 through the ILD 270 and the dielectric layer 260. As shown, the via 280 can include a liner 282 and a contact 284. The liner 282 and the contact 284 can include any suitable materials in accordance with the embodiments described herein. For example, the liner 282 can include, e.g., tantalum (e.g., Ta/TaN), and the contact 284 can include, e.g., copper (Cu).

Figure 17:
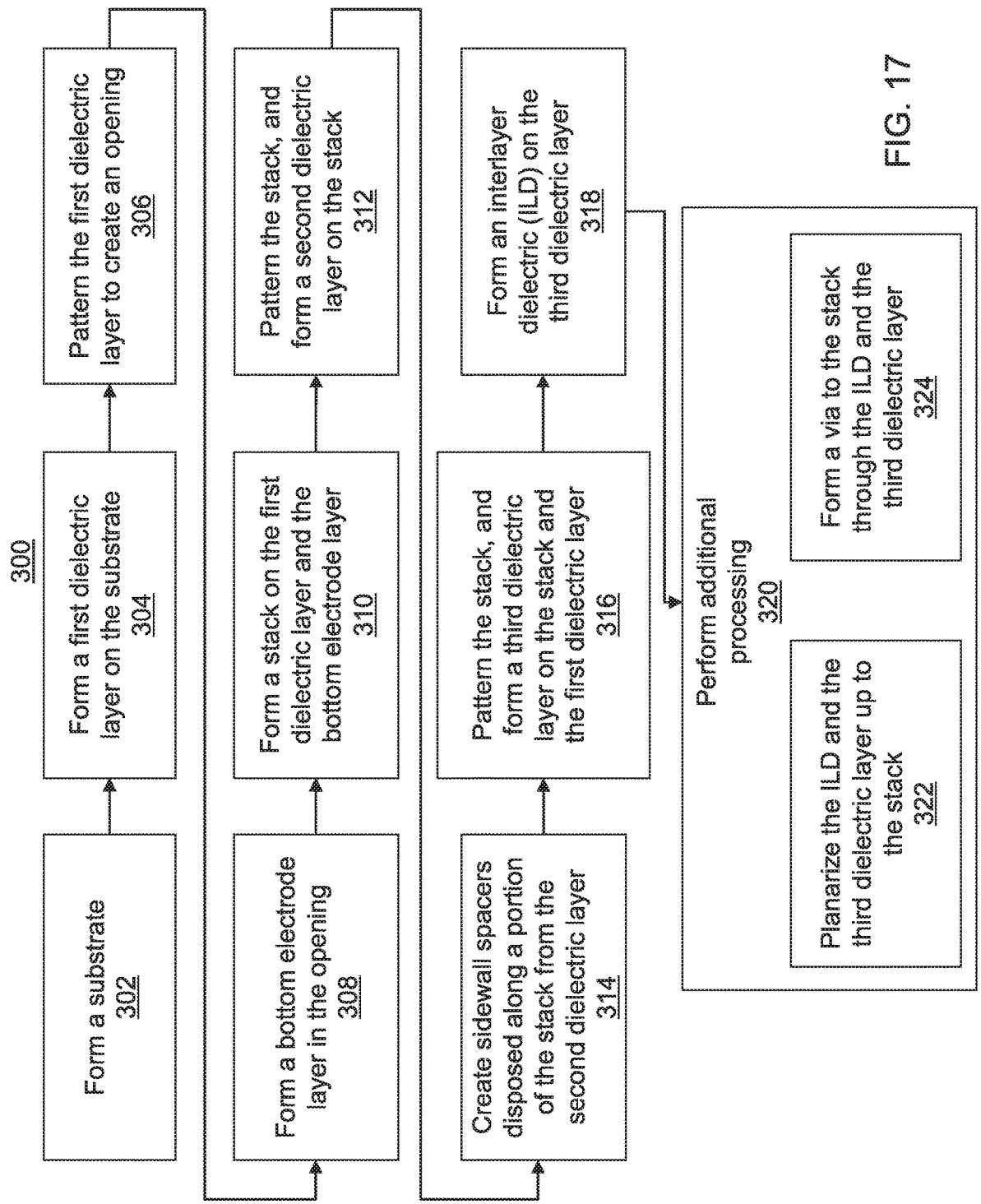
FIG. 17 is a block/flow diagram illustrating a system/method for fabricating a semiconductor device, in accordance with an embodiment of the present invention.

With reference to FIG. 17, a block/flow diagram is shown illustrating a system/method 300 for fabricating a semiconductor device including stacked access device and resistive memory, in accordance with an embodiment.

At block 302, a substrate is formed. The substrate can include any suitable substrate structure, e.g., a bulk semiconductor, a semiconductor-on-insulator (SOI) substrate, etc. In one example, the substrate can include a silicon-containing material. Illustrative examples of Si-containing materials suitable for the substrate can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc.

At block 304, a first dielectric layer is formed on the substrate. The first dielectric layer can include any suitable material in accordance with the embodiments described herein. Examples of suitable materials that can be included in the first dielectric layer include, but are not limited to, nitride materials (e.g., silicon nitride (SiN)), oxide materials (e.g., silicon dioxide ($SiO_2$)), oxynitride materials (e.g., silicon oxynitride (SiON)), etc.

At block 306, the first dielectric layer is patterned to create an opening.

At block 308, a bottom electrode layer is formed in the opening. The bottom electrode layer can be formed by depositing a bottom electrode layer material, and planarizing the bottom electrode layer material (e.g., by using chemical-mechanical planarization (CMP)). The bottom electrode layer can include any suitable material in accordance with the embodiments described herein. Examples of suitable materials that can be included in the bottom electrode layer include, but are not limited to, titanium-based materials (e.g., titanium nitride materials (e.g., TiN)), tantalum-based materials (e.g., tantalum nitride materials (e.g., TaN)), and tungsten-based materials (e.g., W).

At block 310, a stack is formed on the first dielectric layer and the bottom electrode layer. In one embodiment, the stack can include a ReRAM device stack, an access device stack disposed on the ReRAM device stack, and a mask disposed on the access device stack.

For example, the ReRAM device stack can include a metal oxide layer and a middle electrode layer disposed on the metal oxide layer. In one embodiment, the metal oxide layer can include a transition metal oxide material. Examples of metal oxide materials that can be included in the metal oxide layer include, but are not limited to, hafnium oxide materials ($HfO_x$), tantalum oxide materials ($TaO_x$), aluminum oxide materials (AlOx), zirconium oxide materials (ZrOx) and titanium oxide materials ($TiO_x$). The middle electrode layer can include any suitable material in accordance with the embodiments described herein. Examples of suitable materials that can be included in the middle electrode layer include, but are not limited to, titanium-based materials (e.g., Ti and/or TiN) and tantalum-based materials (e.g., TaN).

The access device stack can include an MIEC layer and at least one top electrode layer disposed on the MIEC layer. The MIEC layer and the at least one top electrode layer can include any suitable materials in accordance with the embodiments described herein. For example, the MIEC layer can include, e.g., a copper germanium sulfide material ($Cu_xGe_yS_z$), and the at least one top electrode layer can include, e.g., ruthenium (Ru), iridium (Ir), platinum (Pt), and/or gold (Au).

In one embodiment, the mask can include a hardmask material. The mask can include any suitable material in accordance with the embodiments described herein. For example, the mask can include, e.g., tantalum-based materials (e.g., TaN) and/or titanium-based materials (e.g., TiN).

In another embodiment, the stack can include an access device stack, a ReRAM device stack disposed on the access device stack, and a mask disposed on the ReRAM stack.

For example, the access device stack can include an MIEC layer, and a middle electrode layer disposed on the MIEC layer. The MIEC layer can include, e.g., a copper germanium sulfide material ($Cu_xGe_yS_z$), and the middle electrode layer can include, e.g., ruthenium (Ru), iridium (Ir), platinum (Pt), and/or gold (Au).

The ReRAM device stack can include a metal oxide layer, a first top electrode layer disposed on the metal oxide layer, and a second top electrode layer disposed on the first top electrode layer. In one embodiment, the metal oxide layer can include a transition metal oxide material. Examples of metal oxide materials that can be included in the metal oxide layer include, but are not limited to, hafnium oxide materials ($HfO_x$), tantalum oxide materials ($TaO_x$) titanium oxide materials ($TiO_x$), aluminum oxide materials (AlOx), and zirconium oxide materials (ZrOx). The first and second top electrode layers can include any suitable materials in accordance with the embodiments described herein. For example, the first and second top electrode layers can include, e.g., titanium-based materials (e.g., TiN and/or Ti) and/or tantalum-based materials (e.g., TaN).

The mask can include any suitable dielectric material in accordance with the embodiments described herein. Examples of suitable materials that can be included in the mask include, but are not limited to, nitride materials (e.g., silicon nitride (SiN)), oxide materials (e.g., silicon dioxide ($SiO_2$)), oxynitride materials (e.g., silicon oxynitride (SiON)), etc.

At block 312, the stack is patterned, and a second dielectric layer is formed on the stack. In the embodiment in which the access device stack is disposed on the ReRAM device stack, the access device stack can be patterned, and the second dielectric layer can be conformally deposited along the patterned access device stack, and along the middle electrode layer of the ReRAM device stack. In the embodiment in which the ReRAM device stack is disposed on the access device stack, the ReRAM device stack can be patterned, and the second dielectric layer can be conformally deposited along the patterned ReRAM device stack, and along the middle electrode layer of the access device stack.

At block 314, sidewall spacers disposed along a portion of the stack are formed from the second dielectric layer. The sidewall spacers can be formed by etching portions of the second dielectric layer.

At block 316, the stack is patterned, and a third dielectric layer is formed on the stack and the first dielectric layer. In the embodiment in which the access device stack is disposed on the ReRAM device stack, the ReRAM device stack can be patterned. In the embodiment in which the ReRAM device stack is disposed on the access device stack, the access device stack can be patterned. Patterning the stack can include removing the mask from the stack. The third dielectric layer can be conformally deposited along the remaining portions of the stack and the first dielectric layer.

At block 318, an interlayer dielectric (ILD) is formed on the third dielectric layer. The ILD can include any suitable dielectric material in accordance with the embodiments described herein. For example, the ILD can include, e.g., silicon dioxide ($SiO_2$).

At block 320, additional processing is performed.

In one embodiment, at block 322, the additional processing can include planarizing the ILD and the third dielectric layer to the stack (e.g., up to the at least one top electrode layer).

In another embodiment, at block 324, the additional processing can include forming a via to the stack (e.g., up to the at least one top electrode layer) through the ILD and the third dielectric layer. The via can include a liner and a contact. The liner and the contact can include any suitable materials in accordance with the embodiments described herein. For example, the liner can include, e.g., tantalum (e.g., Ta/TaN), and the contact can include, e.g., copper (Cu).

Further details regarding the processes of FIG. 17 are described above with reference to FIGS. 1-16.

Having described preferred embodiments of a semiconductor device including stacked access device and resistive memory and a method of fabricating the same (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for fabricating a semiconductor device including a stacked memory device, comprising:
   forming a stack on a base structure, the stack including an access device stack disposed in direct contact with a resistive random-access memory (ReRAM) device stack, and a mask disposed on the access device stack, wherein the base structure includes a bottom electrode layer, the ReRAM device stack includes a middle electrode layer, and the access device stack includes a top electrode layer disposed in direct contact with a mixed ionic-electronic conductor (MIEC) layer, with the MIEC layer including at least sulfur directly contacting the middle electrode layer of the ReRAM stack;
   patterning the access device stack using the mask to form a patterned access device stack on the ReRAM device stack;
   forming a first dielectric layer over the patterned access device stack;
   creating sidewall spacers disposed along the patterned access device stack from the first dielectric layer;
   removing the mask by patterning the ReRAM device stack to form a patterned stack including a patterned ReRAM device stack and the patterned access device stack; and
   conformally depositing a second dielectric layer over the patterned stack, the sidewall spacers and the base structure.

2. The method of claim 1, further comprising forming an interlayer dielectric over the second dielectric layer.

3. The method of claim 2, wherein:
   the middle electrode layer is disposed on a metal oxide layer.

4. The method of claim 3, further comprising forming the base structure, including:
   depositing a third dielectric layer on a substrate;
   patterning the third dielectric layer to create an opening within the third dielectric layer; and
   forming the bottom electrode layer on the substrate in the opening.

5. The method of claim 3, further comprising planarizing the interlayer dielectric and the second dielectric layer to the top electrode layer.

6. The method of claim 3, further comprising forming a via contacting the top electrode layer through the interlayer dielectric and the second dielectric layer.

* * * * *